(12) United States Patent       (10) Patent No.:     US 7,889,255 B2
Inoue et al.                    (45) Date of Patent:     Feb. 15, 2011

(54) SOLID-STATE IMAGING DEVICE COMPRISING A SIGNAL STORAGE SECTION INCLUDING A HIGHLY DOPED AREA (75) Inventors: Ikuko Inoue, Yokohama (JP); Hirofumi Yamashita, Fujisawa (JP); Nagataka Tanaka, Yokohama (JP); Hisanori Ihara, Yokohama (JP); Tetsuya Yamaguchi, Tokyo (JP); Hiroshige Goto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1470 days.

(21) Appl. No.: 11/251,882

(22) Filed: Oct. 18, 2005

(65) Prior Publication Data

US 2006/0082669 A1     Apr. 20, 2006

(30) Foreign Application Priority Data

Oct. 19, 2004 (JP) .............................. 2004-304485

(51) Int. Cl.
*H04N 3/14* (2006.01)
*H04N 5/335* (2006.01)

(52) U.S. Cl. ...................................... 348/302; 348/281
(58) Field of Classification Search .............. 250/208.1; 348/281, 294, 302, 308
See application file for complete search history.

(56) References Cited

U.S. PATENT DOCUMENTS 6,326,655 B1   12/2001   Suzuki
6,690,423 B1    2/2004   Nakamura et al.
2002/0118291 A1*  8/2002  Ishigami et al. ............. 348/311
2004/0108502 A1   6/2004  Nakamura et al.
2004/0232494 A1* 11/2004  Nagano et al. .............. 257/382
2005/0001143 A1*  1/2005  Rhodes .................... 250/208.1

FOREIGN PATENT DOCUMENTS

| JP | 11-274463    | 10/1999 |
| JP | 2000-91552   | 3/2000  |
| JP | 2000-150848  | 5/2000  |
| JP | 2001-15727   | 1/2001  |
| JP | 2004-193547  | 7/2004  |
| WO | WO 03/096421 | 11/2003 |

* cited by examiner

*Primary Examiner*—Sinh Tran
*Assistant Examiner*—Hung H Lam
(74) *Attorney, Agent, or Firm*—Oblon, Spivak, McClelland, Maier & Neustadt, L.L.P.

(57) ABSTRACT

Each of the unit cells provided on a semiconductor substrate of a solid-state imaging device comprises a first p-type well which isolates the semiconductor substrate into an n-type photoelectric conversion region, a second p-type well which is formed in the surface of the photoelectric conversion region and in which a signal scanning circuit section is formed, and a signal storage section which is comprised of a highly doped n-type layer which is formed in the surface of the photoelectric conversion region apart from the second p-type well and higher in impurity concentration than the photoelectric conversion region. The signal storage section having its part placed under a signal readout gate adapted to transfer a packet of signal charge from the storage section to the signal scanning circuit section and its part at which the potential becomes deepest located under the readout gate.

6 Claims, 11 Drawing Sheets

SOLID-STATE IMAGING DEVICE COMPRISING A SIGNAL STORAGE SECTION INCLUDING A HIGHLY DOPED AREA

CROSS-REFERENCE TO RELATED APPLICATIONS

This application is based upon and claims the benefit of priority from prior Japanese Patent Application no. 2004-304485, filed on Oct. 19, 2004, the entire contents of which are incorporated herein by reference.

BACKGROUND OF THE INVENTION

1. Field of the Invention

The present invention relates to a MOS type of solid-state imaging device and more particularly to a solid-state imaging device for use with a low-voltage-driven and moving-image-compatible CMOS sensor camera or the like.

2. Description of the Related Art

In recent years, a MOS type of solid-state imaging device using an amplification type of MOS sensor has been put into practice as one of the solid-state imaging devices. This solid-state imaging device, which is adapted to amplify a signal detected by a photodiode provided for each pixel through a MOS transistor, has a feature of high sensitivity.

The pixels of the MOS type of solid-state imaging device are each composed of a photodiode adapted to provide photoelectric conversion, a readout transistor adapted to read a signal, an amplifying transistor adapted to amplify the signal, a vertical select transistor adapted to select a read line, a reset transistor for resetting a signal charge, etc. The amplifying transistor has its source connected to a vertical signal line. A signal read onto a vertical signal line is output onto a horizontal signal line through a horizontal select transistor.

Figure 13:
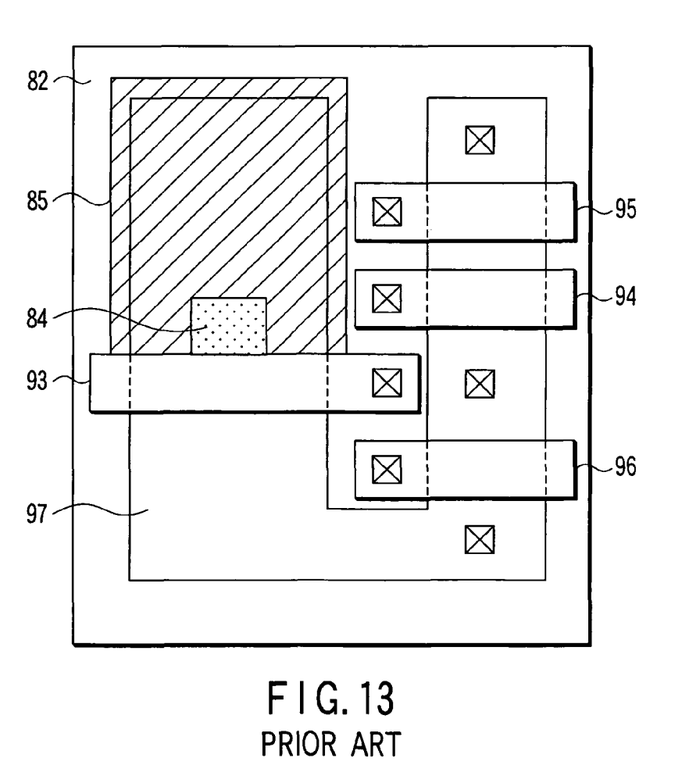
FIGS. 13 and 14 are plan and sectional views, respectively, of one pixel in a conventional MOS solid-state imaging device.
Figure 14:
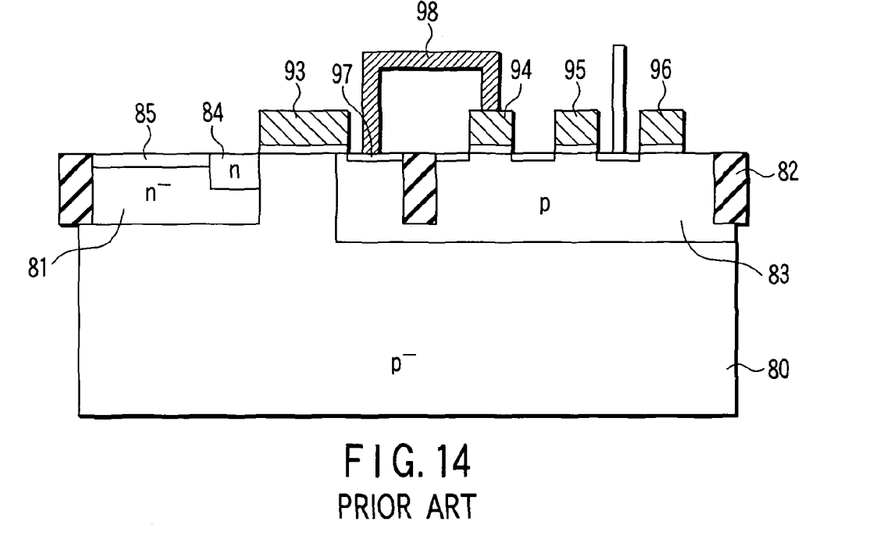

FIGS. 13 and 14 illustrate the structure of one pixel in a conventional MOS type of solid-state imaging device disclosed in, for example, Japanese Unexamined Patent Publication NO. 2000-91552. FIG. 13 is a plan view and FIG. 14 is a sectional view. In these figures, 80 denotes a p-type substrate, 81 a photoelectric conversion section (n-type layer) which serves as an embedded photodiode, 82 a device isolation layer, 83 a scanning transistor well (p-type layer), 84 a signal storage section (n-type layer), 85 a surface shield layer (p-type layer), 93 the gate of a signal readout transistor, 94 the gate of an amplifying transistor, 95 the gate of an address transistor, 96 the gate of a reset transistor, 97 the source/drain of a scanning transistor, and 98 an interconnect line.

Figure 15A:
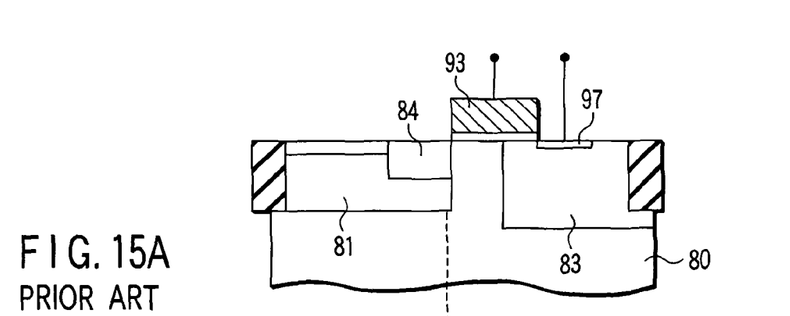
FIG. 15A shows the sectional view of one pixel in the conventional solid-state imaging device in a more simplified form than FIG. 14.
Figure 15B:
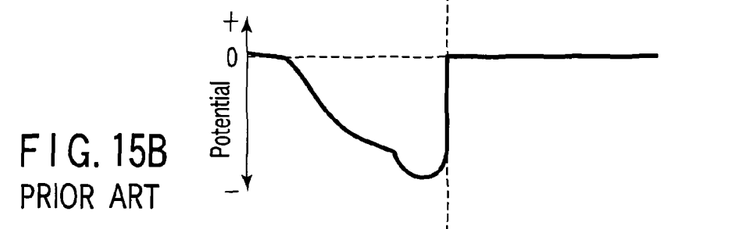
FIG. 15B shows the potential profile in one pixel at signal storage time in the conventional solid-state imaging device with reference to the sectional view of FIG. 15A.
Figure 15C:
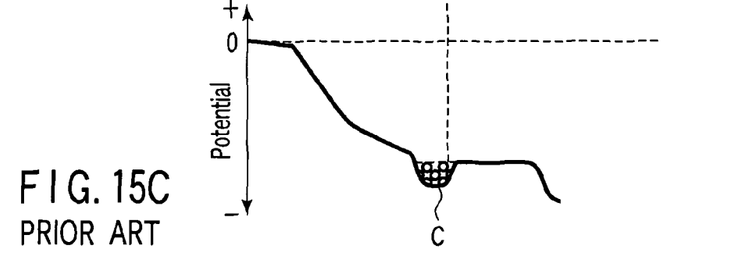
FIG. 15C shows the potential profile in one pixel at signal readout time in the conventional solid-state imaging device with reference to the sectional view of FIG. 15A.

However, this type of device has such problems as will be explained below with reference to FIGS. 15A, 15B, and 15C which show internal potential profiles in the sectional structure of FIG. 14. That is, in the sectional structure shown in FIG. 15A, as shown in FIG. 15B, the part which is deepest in potential in the photoelectric conversion section 81 including the signal storage section 84 is located outside the readout gate 93. For this reason, when the readout gate 93 is driven with a low voltage, a potential pocket is produced in the signal storage section 81 and some charge C remains in this pocket as shown in FIG. 15C. This means that all the signal charge produced as the result of receiving light cannot be read out with certainty. That is, a potential barrier produced at the side of the readout gate does not allow a part C of signal charge produced in the photoelectric conversion section 81 to be transferred, resulting in a residual image.

One might suggest extending a part of the signal storage section 84 to under the readout gate 93. However, since the potential profile is affected not only by the signal storage section 84 but also by the photoelectric conversion section 81, the part of the deepest potential would be positioned under the photoelectric conversion section 81 even if a part of the signal storage section 81 in the structure of FIG. 14 were extended to under the readout gate 93. Thus, the deepest potential part would still be positioned outside the readout gate 93. Therefore, this approach cannot avoid the problem of potential barrier.

A method has been proposed which forms the readout gate to conform to the position of deepest potential in the corresponding photodiode (see, for example, Japanese Unexamined Patent Publication No. 11-274463). With this method, however, the readout gate electrode overhangs the light receiving section of the corresponding pixel, blocking a part of the light path. With this method, therefore, the residual image is lowered but there arises a problem of shading in which a change in color occurs in the periphery of an image due to misalignment occurring in processing steps.

Thus, in the conventional low-voltage-driven MOS type of solid-state imaging device, a packet of signal charge produced by a photoelectric conversion section cannot be transferred in its entirety to the signal scanning circuit, thereby causing a residual image and kTc noise.

BRIEF SUMMARY OF THE INVENTION

According to an aspect of the present invention, there is provided a solid-state imaging device having an imaging area in which unit cells each including a photoelectric conversion section and a signal scanning circuit section are arranged in a two-dimensional form on an n-type semiconductor substrate, comprising: a first p-type semiconductor region which isolates the semiconductor substrate into an n-type photoelectric conversion region where the photoelectric conversion section is formed and a substrate region; a second p-type semiconductor region which is formed in the surface of the photoelectric conversion region and in which the signal scanning circuit section is formed; and a signal storage section which is comprised of an n-type layer which is formed in the surface of the photoelectric conversion region apart from the second p-type semiconductor region and higher in impurity concentration than the photoelectric conversion region, the signal storage section having its part placed under a signal readout gate adapted to transfer a packet of signal charge from the storage section to the signal scanning circuit section and its part at which the potential becomes deepest located under the readout gate.

According to another aspect of the present invention, there is provided a solid-state imaging device having an imaging area in which unit cells each including a photoelectric conversion section and a signal scanning circuit section are arranged in a two-dimensional form on a p-type semiconductor substrate, comprising: an n-type semiconductor region which is formed on the semiconductor substrate and in which the photoelectric conversion section is formed; a p-type semiconductor region which is formed in the surface of the photoelectric conversion region and in which the signal scanning circuit section is formed; and a signal storage section which is comprised of a highly doped n-type layer which is formed in the surface of the photoelectric conversion region apart from the p-type semiconductor region and higher in impurity concentration than the photoelectric conversion region, the signal storage section having its part placed under a signal readout gate adapted to transfer a packet of signal charge from the storage section to the signal scanning circuit section and its part at which the potential becomes deepest located under the readout gate.

BRIEF DESCRIPTION OF THE SEVERAL VIEWS OF THE DRAWING

FIG. 11 is a block diagram of a merged memory and logic LSI chip or a system-configured LSI chip which has a MOS solid-state imaging device of the present invention built in;

DETAILED DESCRIPTION OF THE INVENTION

The embodiments of the present invention will be described hereinafter with reference to the accompanying drawings.

First Embodiment

Figure 1:
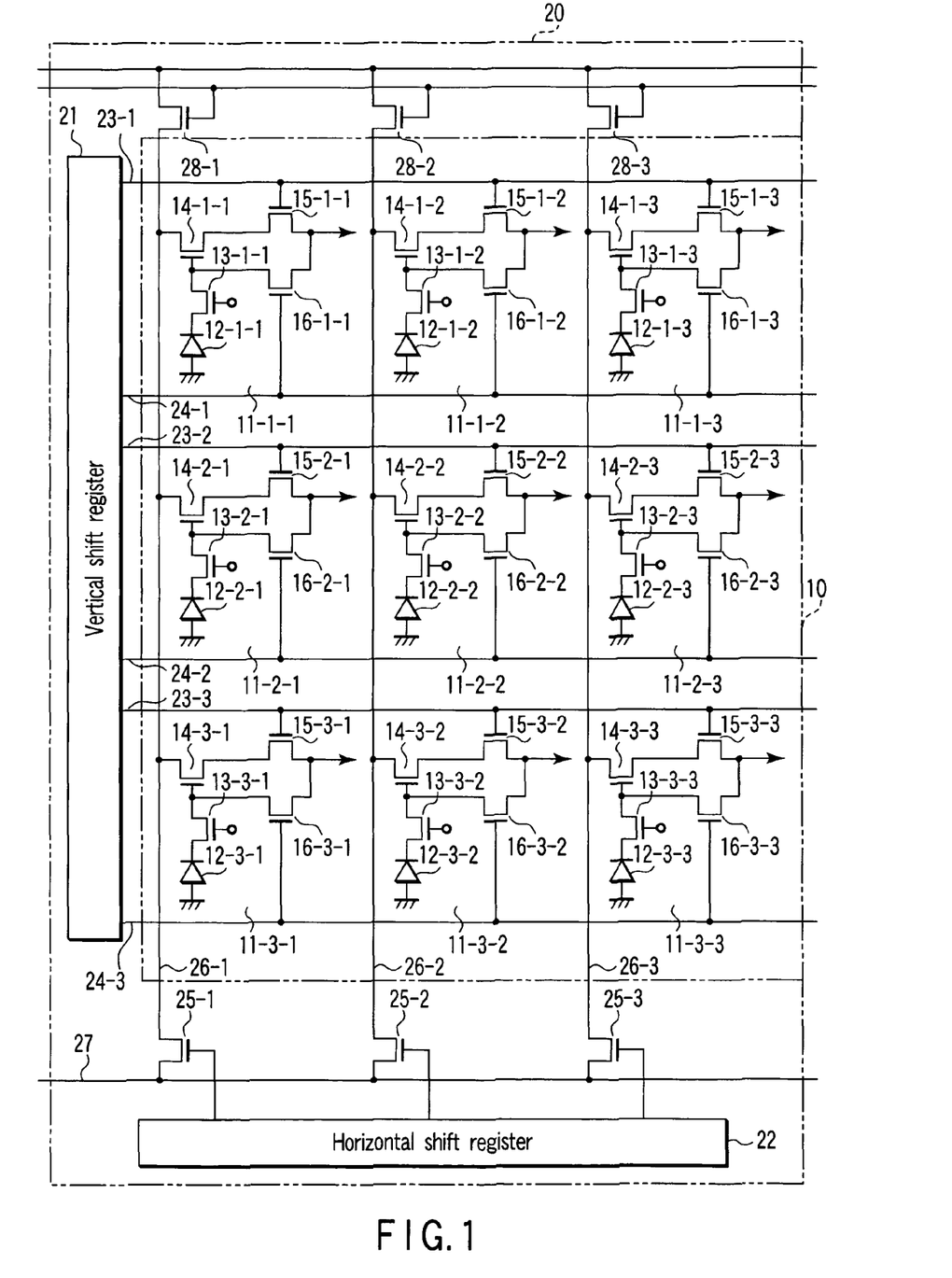
FIG. 1 shows the circuit arrangement of a MOS solid-state imaging device according to a first embodiment of the present invention.

FIG. 1 shows the circuit arrangement of a MOS solid-state imaging device according to a first embodiment of the present invention.

In an imaging area 10, unit pixels are arranged in a two-dimensional form (3×3 pixels are shown in the drawing). Each of the pixels is comprised of a photodiode 12 (12-1-1, 12-1-2, ..., 12-3-3) for photoelectric conversion, a readout transistor 13 (13-1-1, 13-1-2, ..., 13-3-3) for reading a signal from the corresponding photodiode, an amplifying transistor 14 (14-1-1, 14-1-2, ..., 14-3-3) for amplifying the read signal from the readout transistor, a vertical select transistor 15 (15-1-1, 15-1-2, ..., 15-3-3) for selecting a line onto which the read signal is read, a reset transistor 16 (16-1-1, 16-1-2, ..., 16-3-3) for resetting signal charge. In the drawing, only the 3×3 pixels are illustrated in order to simplify the description. However, in practice, a very large number of unit pixels (for example, several mega-pixels) are arranged in commercially available digital still cameras.

Though not shown, pixels which determine a signal when no light is present (hereinafter referred to as OB pixels) are placed at one end of the imaging area 10. Like the unit pixel, the OB pixel is composed of a photodiode 12', a readout transistor 13', an amplifying transistor 14', a vertical select transistor 15', and a reset transistor 16'.

Address lines 23 (23-1, 23-2, 23-3) extending in the horizontal direction from a vertical shift register 21 are each connected to the gates of the corresponding vertical select transistors 15 to determine a line onto which a signal is to be read. Reset lines 24 (24-1, 24-2, 24-3) are each connected to the gates of the corresponding reset transistors 16.

Vertical signal lines 26 (26-1, 26-2, 26-3) are each connected to the sources of the corresponding amplifying transistors 14. Each of the vertical signal lines is connected at its one end to a load transistor 28 (28-1, 28-2, 28-3) and at its other end to a horizontal signal line 27 through a horizontal select transistor 25 (25-1, 25-2, 25-3).

In FIG. 1, 10 denotes the imaging area (pixel area) and 20 denotes peripheral circuitry including shift registers 21 and 22 to scan the imaging area 10. The unit pixels are denoted at 11 (11-1-1, 11-1-2, ..., 11-3-3).

Figure 2:
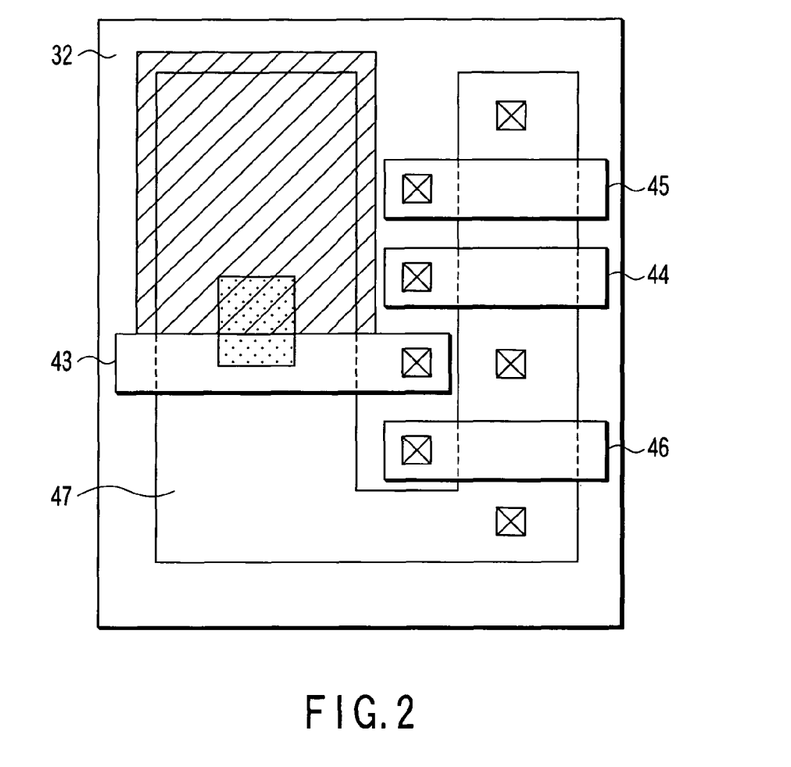
FIG. 2 is a plan view of one pixel in the solid-state imaging device shown in FIG. 1.
Figure 3:
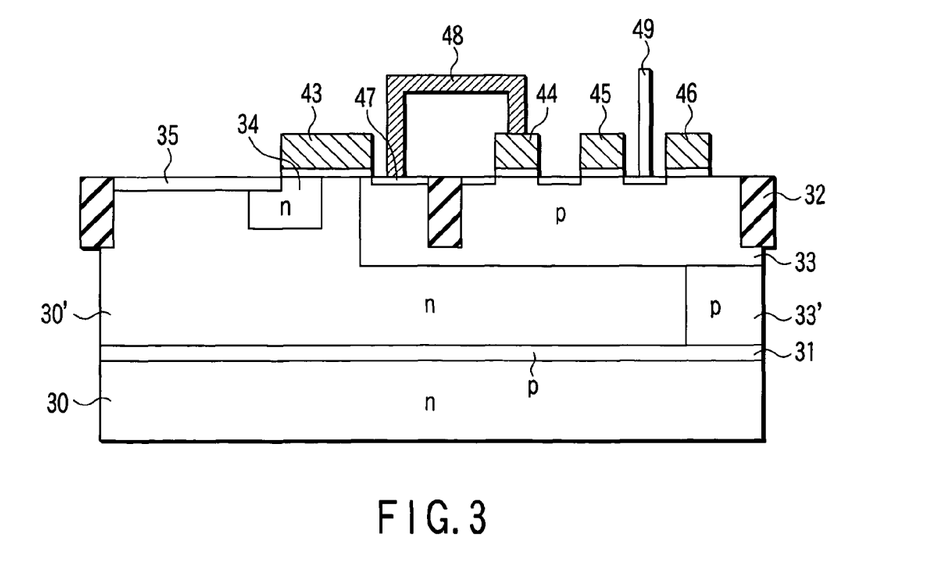
FIG. 3 is a sectional view of one pixel in the solid-state imaging device shown in FIG. 1.

FIGS. 2 and 3 illustrate the structure of one pixel in the solid-state imaging device of the first embodiment and are plan and sectional views, respectively.

In these figures, 30 denotes a p-type silicon substrate. A p-type well (first p-type semiconductor substrate) 31, which functions as a device isolation diffusion layer, is formed at a predetermined depth from the substrate surface. This p-type well separates the semiconductor substrate into a lower n-type substrate region 30 and an upper n-type photoelectric conversion region 30'.

In the surface of the photoelectric conversion region 30', a p-type well (second p-type semiconductor region) 33 is formed, which has various MOS transistors formed in it to form a signal scanning circuit section. Also, in the surface of the photoelectric conversion region 30' a signal storage section 34 is formed apart from the p-type well 33. This signal storage section consists of an n-type diffusion layer which is higher in impurity concentration than the photoelectric conversion section 30'. Here, the n-type photoelectric conversion section 30' has an impurity concentration of, say, $1 \times 10^{14}$ cm$^{-3}$ and the n-type signal storage section 34 has an impurity concentration of, say, $5 \times 10^{16}$ cm$^{-3}$. The photoelectric conversion region 30' and the signal storage region 34 are formed on top with a surface shield layer 35 consisting of a p-type diffusion layer. This surface shield layer is intended to suppress the formation of a depletion layer at the surface of the photoelectric conversion section 30' to thereby reduce dark current.

In FIGS. 2 and 3, 32 denotes a device isolation layer, 33' a p-type well as a pixel isolation diffusion layer, 43 the gate of the readout transistor 23 (hereinafter referred to as the readout gate or transfer gate), 44 the gate of the amplifying transistor 24, 45 the gate of the vertical select transistor, 46 the gate of the reset transistor, 47 the source/drain of each transistor, and 48 an interconnect line. The readout gate 43 is formed in the vicinity of the boundary between the p-type well 33 and the n-type photoelectric conversion region 30' at the surface thereof to overlap the signal storage region 34.

The first embodiment is characterized in that the whole of the n-type region 30' enclosed by the p-type wells 31 and 31' is used as a photoelectric conversion section and a part of the signal storage section 34 is formed under the readout gate 43. The signal storage section 34 is formed so that its part of deepest potential is located under the readout gate 43. More specifically, the signal storage section 34 is placed so that its center in the direction of length of the channel of the readout transistor 23 is located on the inside of the readout gate 43 from one edge of the gate. The surface shield layer 35 is formed to cover not only the exposed area of the photoelectric conversion section 30' but also the exposed area of the signal storage section 34.

The method of manufacture of the solid-state imaging device of this embodiment will be described next with reference to FIGS. 4A through 4E.

Figure 4A:
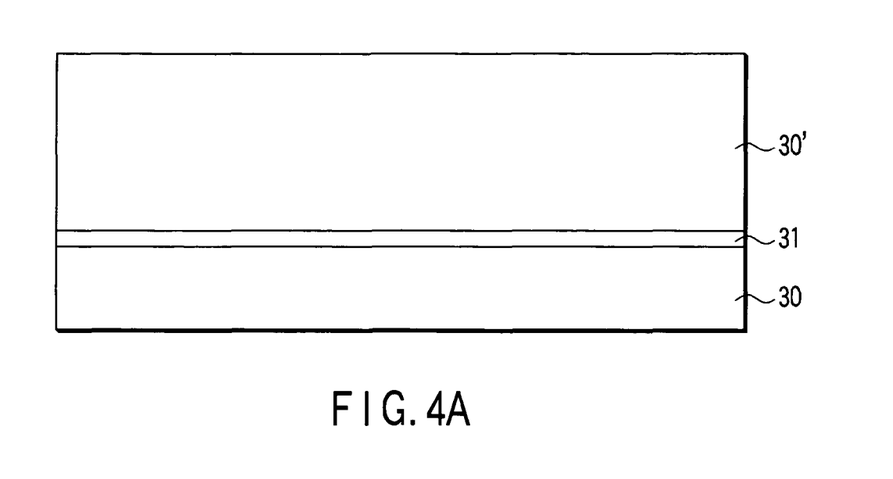
FIGS. 4A through 4E are sectional views, in the order of steps of manufacture, of the solid-state imaging device shown in FIG. 1.

First, as shown in FIG. 4A, ion implantation is performed to form the p-type well 31 into the n-type silicon substrate 30 at a depth of, say, 4 to 10 μm. Thereby, the substrate 30 is separated into the upper photoelectric conversion region 30' and the lower substrate region 30.

Figure 4B:
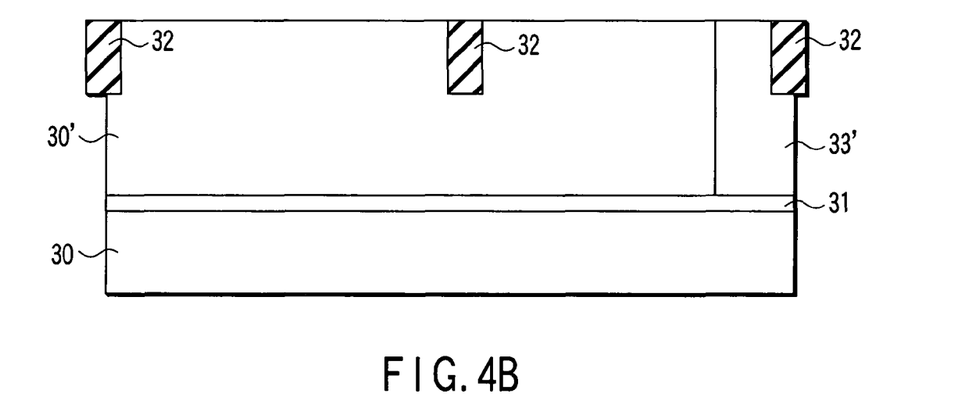

Next, as shown in FIG. 4B, the device isolation layer 31 is formed in the surface of the photoelectric conversion region 30' using an insulating film, such as a buried oxide film. Then, the device isolation diffusion layer 33' is formed in the surface of the photoelectric conversion region 30' so that it adjoins the device isolation layer 32 and reaches the p-type well 31.

Figure 4C:
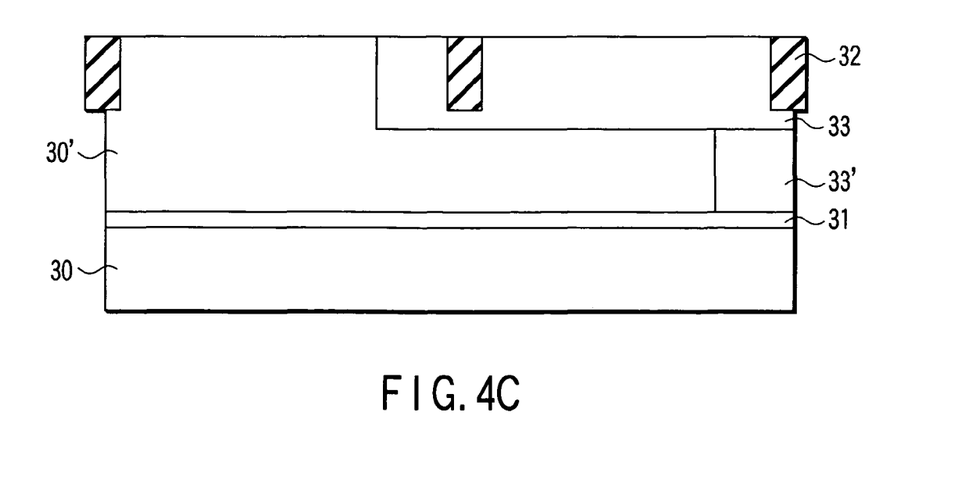

Next, as shown in FIG. 4C, the p-type well 33 in which the signal scanning circuit section is formed is selectively formed in the surface of the photoelectric conversion section 30' a little deeper than the device isolation layer 32. Subsequently, though not shown, a p-type well and an n-type well for the peripheral circuit region are formed.

Figure 4D:
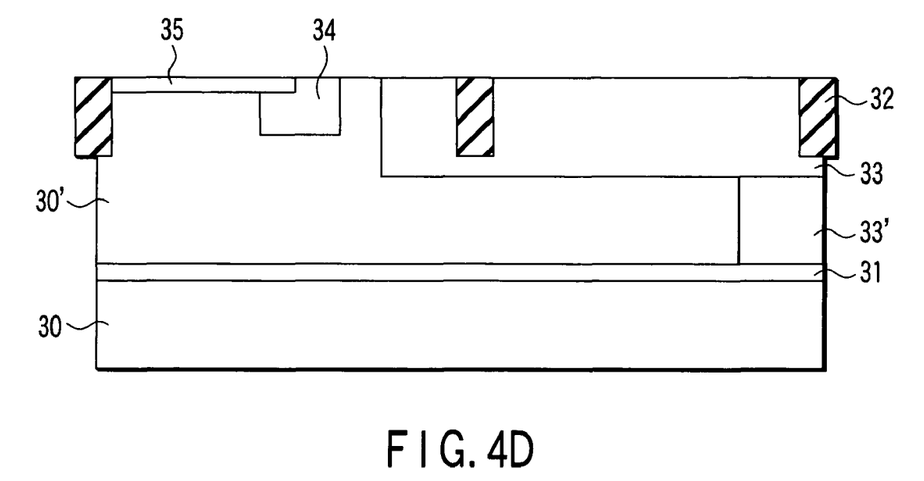

Next, as shown in FIG. 4D, using ion implantation the n-type signal storage section 34 is selectively formed in the surface of the photoelectric conversion section 30' apart from the p-type well 33. Subsequently, the p-type surface shield layer 35 is formed in the surface of the photoelectric conversion region 30' by means of ion implantation so that it overlaps the signal storage region 34.

Figure 4E:
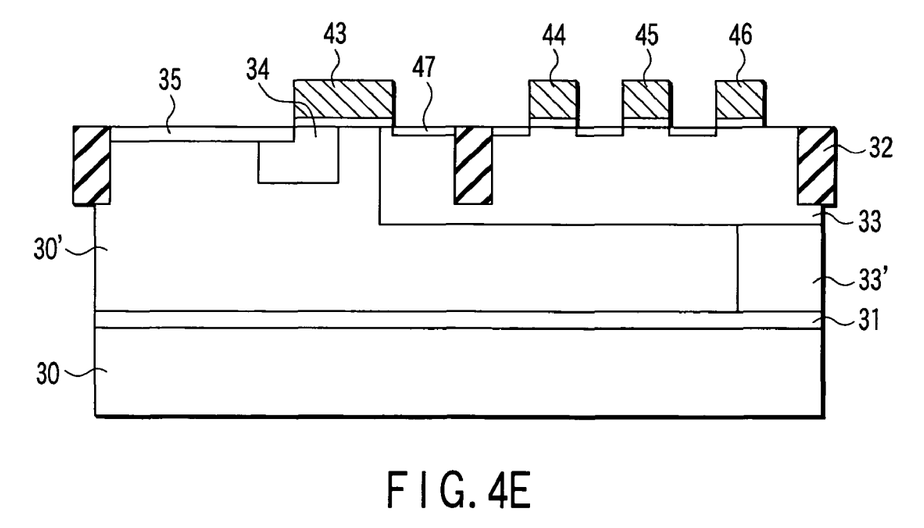

Next, as shown in FIG. 4E, the gate 43 of the readout transistor, the gate 44 of the amplifying transistor, the gate 45 of the vertical select transistor, the gate 46 of the reset transistor, and the source/drain 47 of each transistor are formed.

In subsequent steps, a contact is formed after the formation of an interlayer insulating film not shown and then the interconnect line 48 is formed, thereby obtaining the structure shown in FIG. 3. After that, a light blocking layer, color filters and microlenses and so on are formed.

Figure 5A:
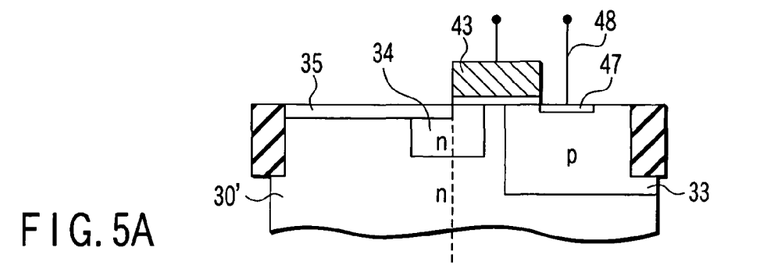
FIG. 5A shows the sectional view of one pixel in the solid-state imaging device of FIG. 1 in a more simplified form than FIG. 3.
Figure 5B:
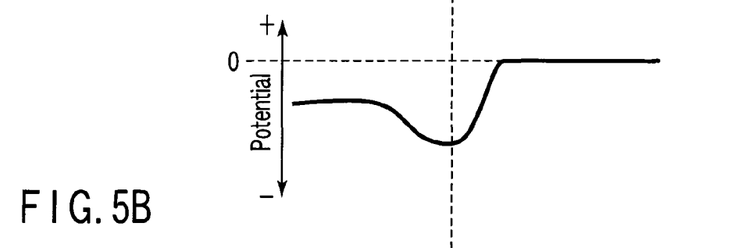
FIG. 5B shows the potential profile in one pixel at signal storage time in the solid-state imaging device of FIG. 1 with reference to the sectional view of FIG. 5A.
Figure 5C:
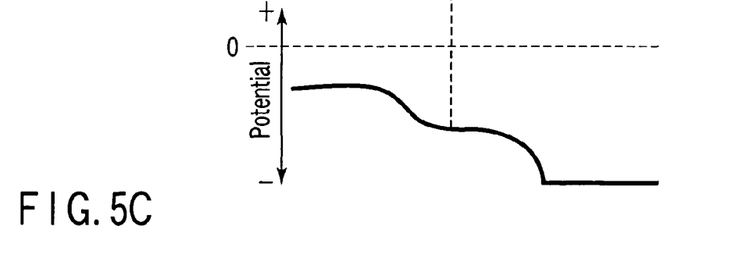
FIG. 5C shows the potential profile in one pixel at signal readout time in the solid-state imaging device of FIG. 1 with reference to the sectional view of FIG. 5A.

Next, the potential profiles at signal storage and read times in the structure of the first embodiment will be described with reference to FIGS. 5A and 5B. The sectional structure shown in FIG. 5A corresponds to the one shown in FIG. 4E. At the signal storage time, the potential is deepest at the center of the signal storage region 34 in the photoelectric conversion section 30' as shown in FIG. 5B. The part at which the potential is deepest is located under one edge part of the readout gate 43. At the signal readout time, therefore, even if the voltage applied to the readout gate 43 is low, the potential at the deepest-potential part in the photoelectric conversion region 30' becomes even deeper because of that low gate voltage as shown in FIG. 5C. A return is then made to the profile of FIG. 5B. That is, the potential always decreases or increases in the direction of length of the channel of the readout transistor 13. Therefore, unlike the conventional device, such a potential pocket C as shown in FIG. 13 will not be produced, allowing a signal charge to be read with certainty even with low voltage driving.

As described above, with this embodiment, the part which is deepest in potential in the photoelectric conversion region 30' is located under the readout gate 43, allowing the potential at the part of deepest potential to be modulated with no need to increase the gate voltage and all the signal charge to be read out without producing a potential pocket. The readout gate 43 can be designed without interrupting the surface shield layer 35 and with no need to consider charge readout and therefore can be placed without interrupting the light path. Thus, the residual image and kTc noise can be lowered without lowering the sensitivity and good images with little deterioration in quality can be obtained.

The surface shield layer 35 is formed to cover not only the exposed area of the photoelectric conversion section 30' but also the exposed area of the signal storage section 34, which is more effective in lowering dark current. In the conventional structure as shown in FIG. 14, if the surface shield layer 35 were formed to cover the signal storage section 34, a potential barrier based on the surface shield layer 35 would make it difficult to read a packet of signal charge. In contrast, in this embodiment, the part of deepest potential in the signal storage section 34 is located under the readout gate 43, which suppresses the production of a potential barrier based on the surface shield layer 35 and allows a packet of signal charge to be read out readily.

Figure 6A:
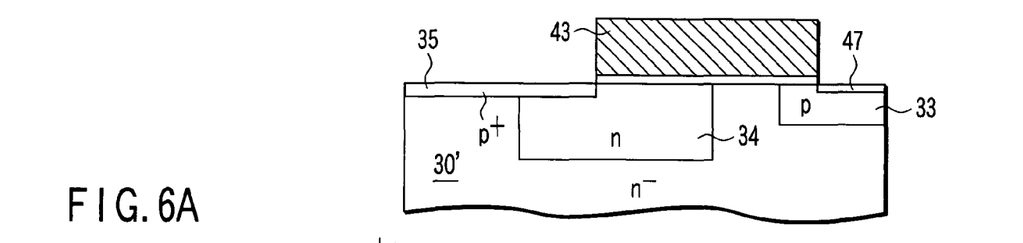
FIG. 6A shows a sectional view of one pixel in the solid-state imaging device of FIG. 1 similarly to FIG. 5A.
Figure 6B:
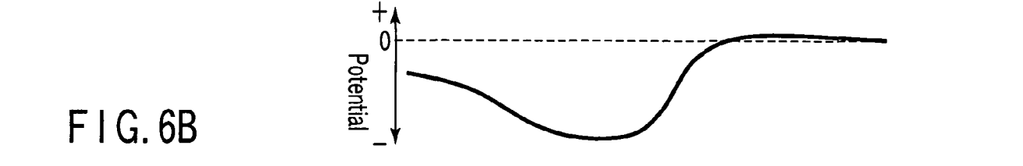
FIG. 6B shows the potential profile in one pixel at signal storage time with reference to the sectional view of FIG. 6A.
Figure 6C:
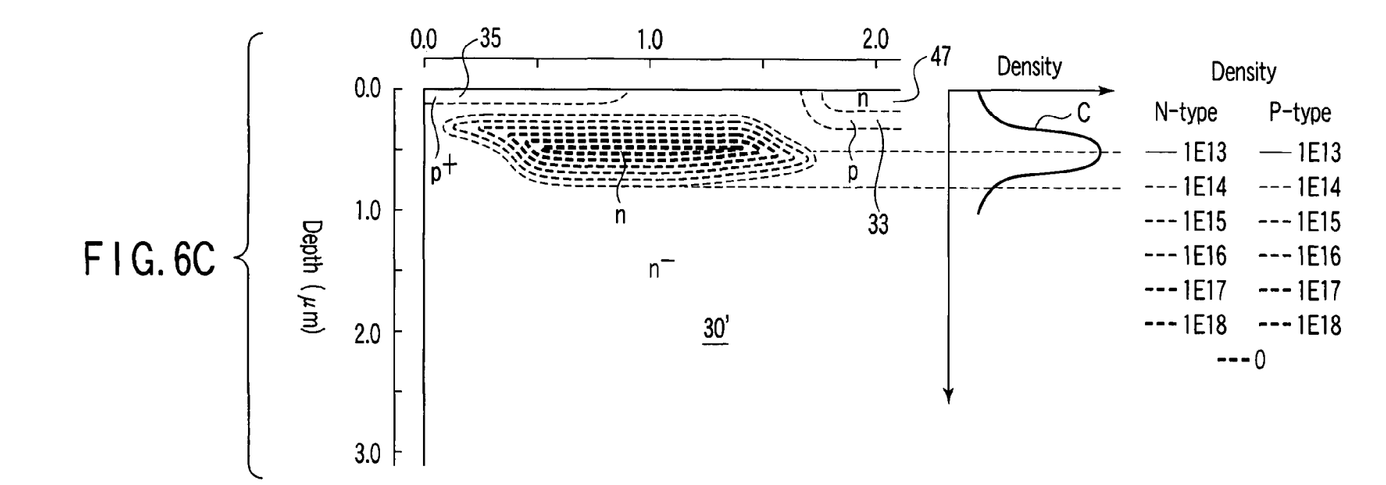
FIG. 6C schematically shows the impurity doping profile in the signal storage section within the photoelectric conversion region in the sectional view of FIG. 6A.

Here, an example of a doping profile of n-type impurities to form the signal storage section 34 will be described with reference to FIGS. 6A, 6B, and 6C. As has been described with reference to FIGS. 5A and 5B, the potential profile at the signal storage time of the signal storage section 34 in the sectional structure of FIG. 6A becomes as shown in FIG. 6B and the potential is deepest at the center of the signal storage region 34 corresponding in position to one edge of the readout gate 43. The signal storage section 34 is formed by first ion implanting n-type impurities at a predetermined depth from the substrate surface at a predetermined dose and then subjecting the impurities to thermal diffusion. FIG. 6C shows the ion density profile of the finally formed signal storage section 34, p-well 33, surface shield layer 35, and drain 47 with reference to the sectional structure of FIG. 6A. As shown in FIG. 6C, the signal storage section 34 is highest in ion density (1E13) at a depth of about 0.5 microns from the substrate surface and its lower surface is located at a position about 0.3 microns deeper than the position of highest ion density where the ion density is low. The impurity doping profile at the lower surface of the signal storage section 34 exhibits a line substantially parallel to the surface of the substrate 30' as shown.

Since the signal storage section 34 has such an ion density profile, electrons which have a negative charge and form a packet of signal charge produced in the photoelectric conversion section 30' are accumulated in the signal storage section 34 which is higher in n-type impurity density than the substrate 30'. At this point, as has been described in conjunction with FIG. 6C, the n-type impurity density in the central part of the signal storage region 34 is high in either of the horizontal and vertical directions of the substrate 307; thus, a greater part of the signal charge is stored in the central part of the signal storage section 34. As the result, the potential profile becomes deepest in the central part of the signal storage section as shown in FIG. 6B.

Second Embodiment

Figure 7:
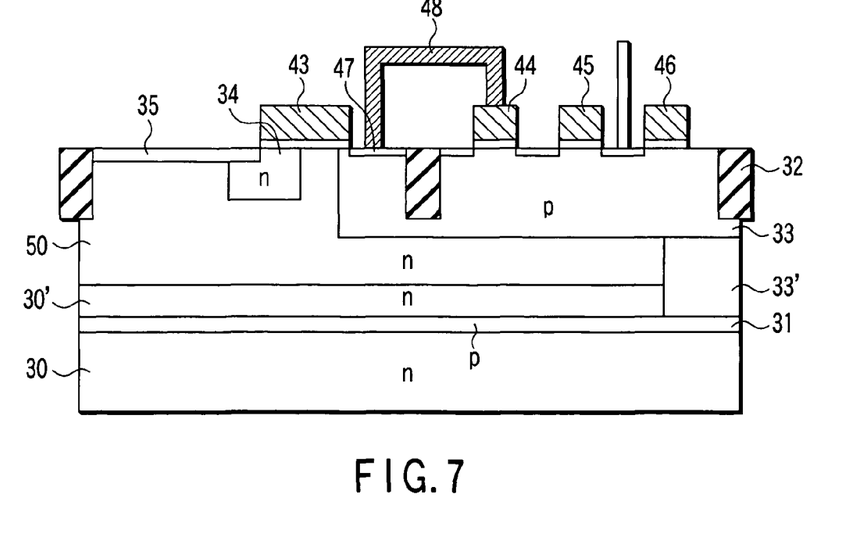
FIG. 7 is a sectional view of one pixel in a solid-state imaging device according to a second embodiment of the present invention.

FIG. 7 is a sectional view of one pixel in a solid-state imaging device according to a second embodiment of the present invention. In FIG. 7, corresponding parts to those in FIG. 3 are denoted by like reference numerals and detailed descriptions thereof are omitted. The second embodiment differs from the first embodiment in that an n-type region 50 is epitaxially grown on the upper region 30' isolated from the substrate 30 by the p-type well 31 and used as the photoelectric conversion section. The n-type region 50 may be formed by ion implantation instead of epitaxial growth.

Otherwise, the second embodiment is basically the same as the first embodiment shown in FIG. 3. As has been described in conjunction with FIGS. 5A to 5C, the part of deepest potential of the signal storage region 34 is located immediately under one edge of the readout gate 43. Also, the p-type well 33' as the pixel isolation layer is formed to extend from the p-type well 33 as the signal scanning circuit forming region to the p-type well 31 as the device isolation diffusion layer.

In this embodiment, the photoelectric conversion section 50 must be set shallower in potential than the signal storage section 34. To this end, the impurity concentrations of the n-type substrate 30, the photoelectric conversion region 50 and the signal storage region 34 are set to, say, $1\times10^{14}$ cm$^{-3}$, $5\times10^{15}$ cm$^{-3}$ and $5\times10^{16}$ cm$^{-3}$, respectively.

When the photoelectric conversion section 50 is formed by means of epitaxial growth in the second embodiment, the p-type well 31 as the device isolation diffusion layer is formed after the epitaxial growth of the n-type region 50 on the n-type substrate 30. The manufacturing steps subsequent to this step are the same as in the first embodiment. When the photoelectric conversion section 50 is formed by means of ion implantation, it may be formed at the same stage as the step of FIG. 4C in the first embodiment.

With such a structure, since the part of deepest potential in the photoelectric conversion section 50 is located under the readout gate 43 at signal readout time, the potential at the part of deepest potential can be modulated without increasing the gate voltage, thus offering the same advantages as the first embodiment. In addition, since the photoelectric conversion section 50 is higher in impurity concentration than the n-type substrate 30' in this embodiment, a saturation current can be increased in magnitude.

Third Embodiment

Figure 8:
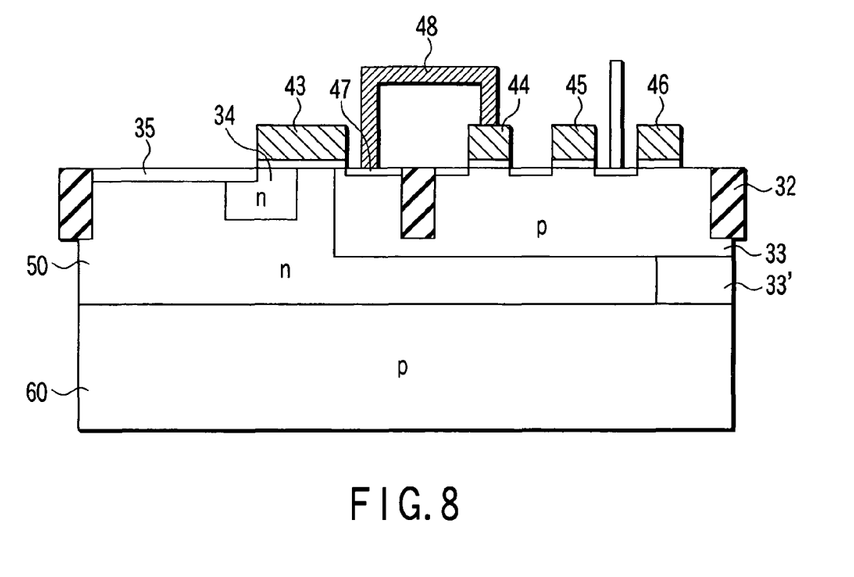
FIG. 8 is a sectional view of one pixel in a solid-state imaging device according to a third embodiment of the present invention.

FIG. 8 is a sectional view of one pixel in a solid-state imaging device according to a third embodiment of the present invention. In FIG. 8, corresponding parts to those in FIGS. 3 and 7 are denoted by like reference numerals and detailed descriptions thereof are omitted.

In the third embodiment, instead of the n-type substrate 30 a p-type substrate 60 is used, which is of opposite conductivity type to the photoelectric conversion section 50. Therefore, the n-type photoelectric conversion section 50 is directly formed on the p-type substrate 60 without the device isolation diffusion layer 31. The photoelectric conversion section 50 can be formed by means of epitaxial growth or ion implantation techniques as in the second embodiment.

In this embodiment as well, the photoelectric conversion section 50 must be set shallower in potential than the signal storage section 34. To this end, the n-type impurity concentrations of the photoelectric conversion section 50 and the signal storage section 34 are simply set as in the case of the second embodiment. When the photoelectric conversion section 50 is formed by means of ion implantation in this embodiment, it may be formed at the same stage as the step of FIG. 4C in the first embodiment.

Even with such a structure, since the part of deepest potential in the photoelectric conversion section 50 is located under the readout gate 43 at signal readout time, the potential at the part of deepest potential can be modulated without increasing the gate voltage, thus offering the same advantages as the first embodiment.

The embodiments of the present invention described above are configured such that an n-type photoelectric conversion section is provided in the whole of an area corresponding to one pixel, a portion of a signal storage section formed in the surface of the photoelectric conversion section is placed under a readout gate, and a part of the signal storage region at which the potential becomes deepest is located under the readout gate. Thus, the part at which the potential becomes deepest can be modulated by the readout gate even if it is driven with a low voltage. Therefore, a packet of signal charge resulting from photoelectric conversion in the photoelectric conversion region can be completely transferred to a signal scanning circuit through low-voltage driving of the readout gate, thus allowing residual image and kTc noise to be lowered.

The present invention is not limited to the embodiments described so far. In the embodiments, the central part of the signal storage section in the direction of length of the channel of the signal readout transistor is located at one edge of the readout gate. However, the central part may be located on the inside of the readout gate but not at one edge of the gate. In short, it is only required that the part of deepest potential of the signal storage region be located under the signal readout gate.

With the embodiments, the unit cell includes a signal scanning circuit composed of a readout transistor, an amplifying transistor, a select transistor, and a reset transistor in addition to a photodiode (photoelectric conversion section). The arrangement of the signal scanning circuit is not limited to the one shown in FIG. 1 but may be modified according to specifications. That is, the signal scanning circuit is only required to have at least the amplifying transistor adapted to amplify a signal resulting from photoelectric conversion in the photoelectric conversion section and a reset transistor adapted to reset the signal. The other transistors may be used as needed.

Fourth Embodiment

Figure 9:
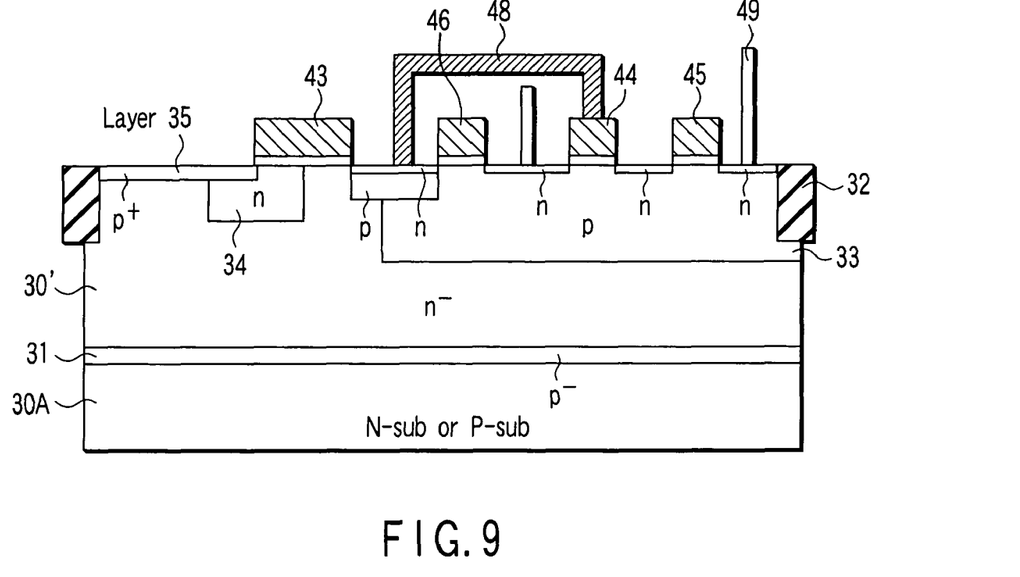
FIG. 9 is a sectional view of one pixel in a solid-state imaging device according to a fourth embodiment of the present invention.

In the third embodiment shown in FIG. 3, the n-type photoelectric conversion region 30' is formed over the surface of the n-type silicon substrate 30 with the p-type device isolation layer 31 interposed therebetween. In contrast, in the fourth embodiment, as shown in FIG. 9, the n-type photoelectric conversion region 30' is formed over the surface of a p-type silicon substrate 30A with the p-type device isolation layer 31 interposed therebetween; otherwise, the fourth embodiment remains unchanged from the third embodiment.

Fifth Embodiment

Figure 10:
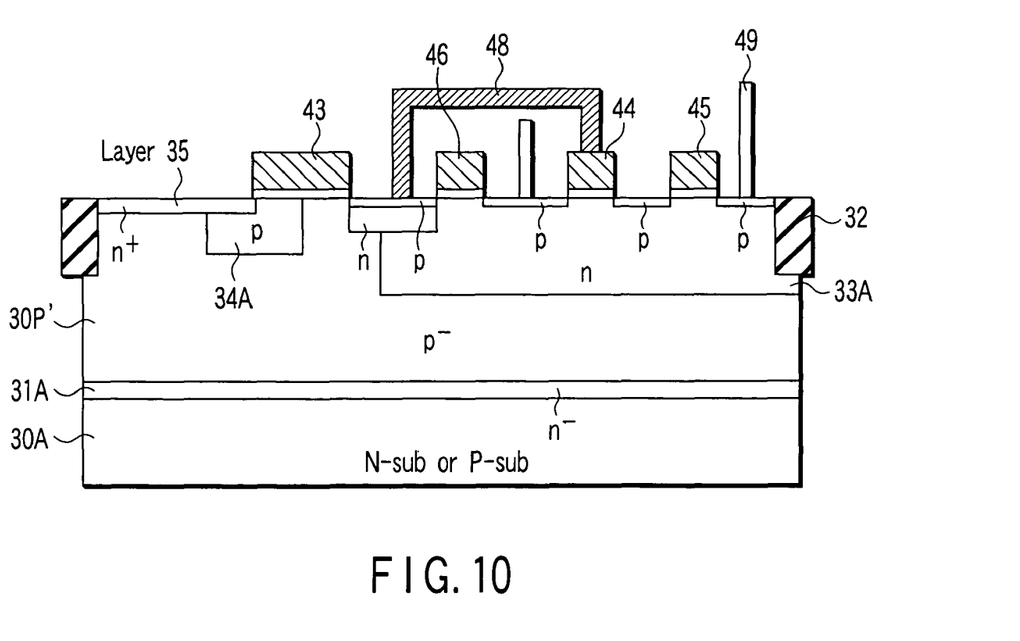
FIG. 10 is a sectional view of one pixel in a solid-state imaging device according to a fifth embodiment of the present invention.

In each of the embodiments described above, the photoelectric conversion region is of n-type and hence the channel immediately under the gate 43 of the signal readout transistor is of n-type; however, it is also feasible to use a p-type channel. FIG. 10 is a sectional view of a fifth embodiment in which the channel is of p-type. As shown, a p-type photoelectric conversion region 30P' is formed over the surface of a n- or p-type semiconductor substrate 30A with an n-type isolation layer 31A interposed therebetween. Therefore, a channel storage layer 34A is of p-type and the channel under the gate 43 of the readout transistor is of p-type. It is required to make the conductivity type of a well region 33A, where the signal scanning circuit is to be formed, n type. Otherwise, the fifth embodiment remains unchanged from the fourth embodiment shown in FIG. 9.

Figure 11:
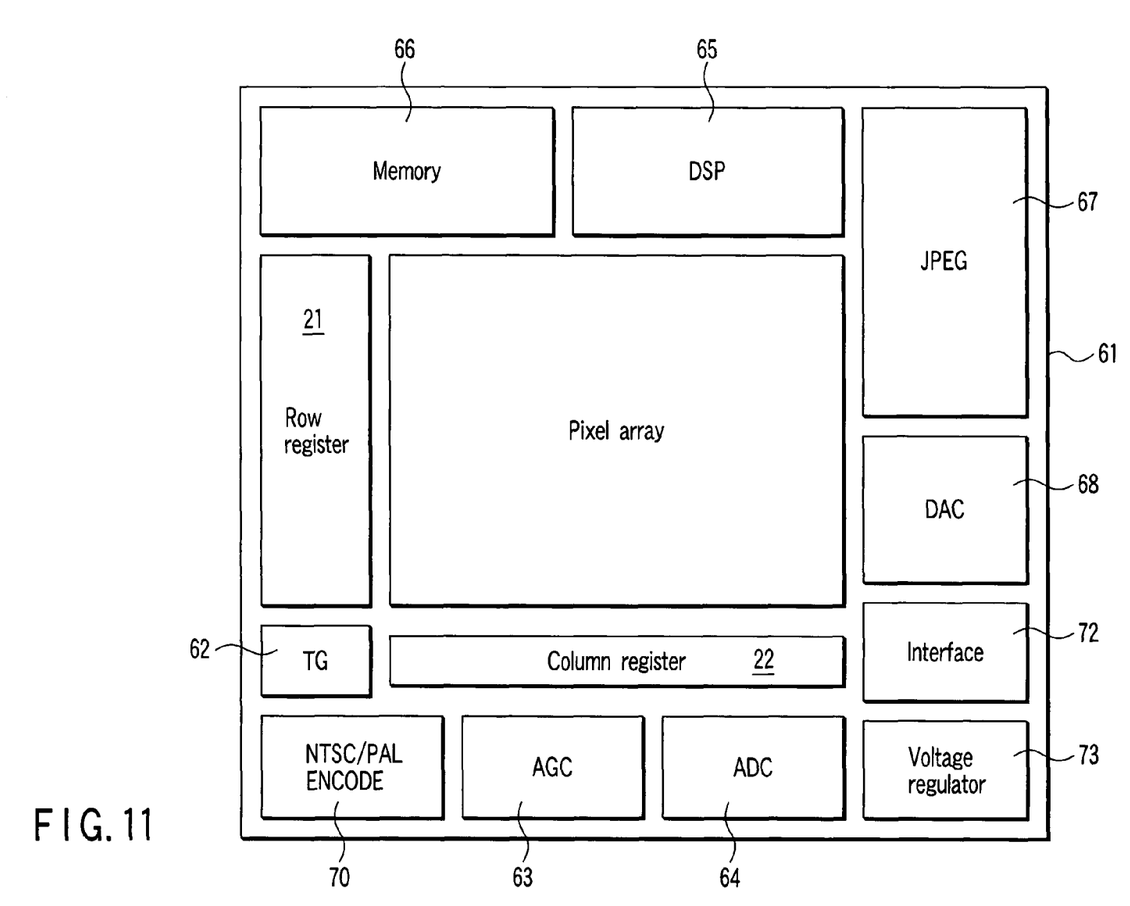

FIG. 11 shows the layout of an LSI formed on one chip and including the pixel array 10 shown in FIG. 1 and the signal scanning circuitry formed around the pixel array. In FIG. 11, the chip 61 has the pixel array 10 placed in its center. A timing generator 62 adapted to control the row register 21 and the column register 22 is placed around the pixel array 10. Further, an AGC (Automatic Gain Control) circuit 63, an ADC (Analog-to-Digital Converter) circuit 64, a DSP (Digital Signal Processor) circuit 65, a memory 66, a JPEG (Joint Photographic Experts Group) circuit 67 and a DAC (Digital-to-Analog Converter) circuit 68 are placed around the pixel array 10.

Figure 12:
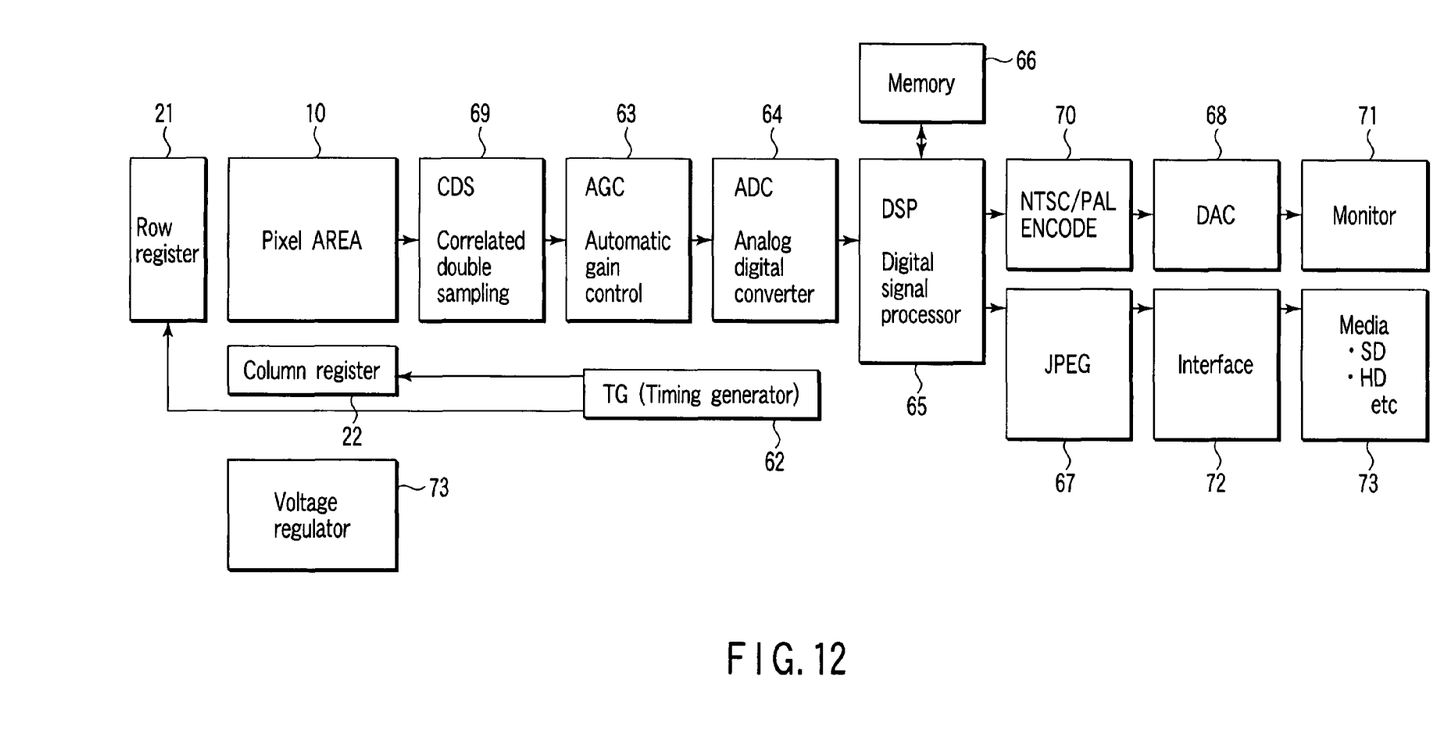
FIG. 12 is a diagram for use in explanation of the operation of the LSI chip of FIG. 11.

Reference is next made to FIG. 12 to describe the operation of the merged memory and logic LSI shown in FIG. 11 and incorporated into a digital still camera. The pixel array 10 is assumed to have a pixel configuration of four transistors per cell like the imaging device 10 shown in FIG. 1. When light from a subject falls on the pixel array 10 in the shooting mode of the camera, an image signal is sequentially read from each pixel by the row and column registers 21 and 22 and then sampled by a CDS (Correlated Double Sampling) circuit 69. The resulting sampled analog image signals are subjected to level adjustment in the SGC circuit 63 and then converted into digital image signals in the ADC circuit 64. The digital image signals are stored as image data into the memory 66 under the control of the DSP circuit 65. The image data is encoded by an encoder 70 into an NTSC or PAL image signal and then converted into an analog signal in the DAC circuit 68. The resulting analog signal is displayed on a monitor 71 to reproduce the subject image. To record the image data captured by the camera on a given recording medium such as an SD or HD, on the other hand, the image data stored in the memory 66 is read by the DSP circuit 65 into the JPEG circuit 67 where it is subjected to compression. The resulting compressed image data is then recorded on a given external storage medium 73, such as an SD or HD, through an interface 72. Each of these circuits is driven by a voltage from an external voltage regulator 73.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device having an imaging area in which unit cells each including a photoelectric conversion section and a signal scanning circuit section are arranged in a two-dimensional form on a p-type semiconductor substrate, comprising:
    an n-type semiconductor region which is formed on the semiconductor substrate and in which the photoelectric conversion section is formed;
    a p-type semiconductor region which is formed in the surface of the photoelectric conversion section and in which the signal scanning circuit section is formed; and
    a signal storage section which is comprised of a highly doped n-type layer which is formed in the surface of the photoelectric conversion section apart from the p-type semiconductor region and higher in impurity concentration than the photoelectric conversion section,
    the signal storage section having its part overlapped under a signal readout gate adapted to transfer a packet of signal charge from the storage section to the signal scanning circuit section and its part at which the potential becomes deepest overlapped under the readout gate;
    wherein the signal storage section is a region doped with impurities in the photoelectric conversion section, the doping profile of the region being such that the impurity concentration is high at its central part and low at its peripheral part;
    wherein the signal storage section has an impurity density in a central part of the signal storage section being high in either of a horizontal and vertical directions of the semiconductor substrate so that a greater part of the signal charge is stored in a central part of the signal storage section and that a potential profile in the signal storage section becomes deepest in the central part which corresponds in position to one edge of the readout gate.

2. The solid-state imaging device according to claim 1, wherein a p-type surface shield layer is formed to cover the entire surface of exposed areas of the photoelectric conversion section and the signal storage section.

3. The solid-state imaging device according to claim 2, wherein one edge of the surface shield layer is formed to be aligned with one edge of the readout gate so that the surface shield layer covers the entire surface of the photoelectric conversion section and a surface of a remaining part of the signal storage section which is not overlapped with the readout gate.

4. The solid-state imaging device according to claim 1, wherein the signal storage section has its center in the direction of length of a channel at the readout gate located on the inside of the signal readout gate but not at one edge of the readout gate.

5. The solid-state imaging device according to claim 1, wherein the signal scanning circuit section comprises a readout transistor adapted to read a signal resulting from photoelectric conversion in the photoelectric conversion section, an amplifying transistor adapted to amplify the read signal, a select transistor adapted to select a line onto which the signal is to be read, and a reset transistor adapted to reset the signal.

6. The solid-state imaging device according to claim 1, wherein at least the highly doped part of the impurity doped region is located under one edge of the readout gate in the direction of a channel length.

* * * * *